United States Patent
Gu et al.

(10) Patent No.: US 10,715,057 B2
(45) Date of Patent: Jul. 14, 2020

(54) METHOD FOR OPERATING A CURRENT CONVERTER AND CURRENT CONVERTER OPERATING ACCORDING TO SAID METHOD

(71) Applicant: VALEO SIEMENS EAUTOMOTIVE GERMANY GMBH, Erlangen (DE)

(72) Inventors: Qiong Gu, Erlangen (DE); Holger Hoffmann, Hessdorf (DE); Thomas Slavik, Zirndorf (DE)

(73) Assignee: VALEO SIEMENS EAUTOMOTIVE GERMANY GMBH, Erlangen (DE)

( * ) Notice: Subject to any disclaimer, the term of this patent is extended or adjusted under 35 U.S.C. 154(b) by 0 days.

(21) Appl. No.: 16/332,204

(22) PCT Filed: Sep. 14, 2017

(86) PCT No.: PCT/EP2017/073102
§ 371 (c)(1),
(2) Date: Mar. 11, 2019

(87) PCT Pub. No.: WO2018/050732
PCT Pub. Date: Mar. 22, 2018

(65) Prior Publication Data
US 2019/0273448 A1   Sep. 5, 2019

(30) Foreign Application Priority Data
Sep. 14, 2016 (DE) .................. 10 2016 217 494

(51) Int. Cl.
*H02M 3/155* (2006.01)
*H02M 7/5387* (2007.01)
(Continued)

(52) U.S. Cl.
CPC ......... *H02M 7/53875* (2013.01); *B60L 15/08* (2013.01); *H02M 3/155* (2013.01);
(Continued)

(58) Field of Classification Search
CPC ...... H02M 3/155; H02M 3/156; H02M 3/158; H02M 7/5387; H02M 7/53871;
(Continued)

(56) References Cited

U.S. PATENT DOCUMENTS

| 8,717,069 B2 * | 5/2014 | Curbelo | ............... H03K 17/163 327/108 |
| 9,024,549 B2 * | 5/2015 | Shi | .......... H02P 29/64 318/139 |

(Continued)

FOREIGN PATENT DOCUMENTS

| DE | 10356467 A1 | 10/2004 |
| DE | 10 2011 079 552 A1 | 1/2013 |

(Continued)

OTHER PUBLICATIONS

PCT/ISA/210, "International Search Report for International Application No. PCT/EP2017/073102", dated Dec. 18, 2017.
(Continued)

*Primary Examiner* — Matthew V Nguyen
(74) *Attorney, Agent, or Firm* — Manabu Kanesaka (57) ABSTRACT

The invention relates to a method for operating a current converter, in particular of an electric machine, in which, for the or for each semiconductor switch of the current converter, a control signal (P') for setting a switch-off speed ($A_{new}$) is generated, wherein an electric intermediate circuit voltage ($U_{dc}$) of an intermediate circuit is measured and compared to a voltage threshold value ($U_{thresh}$), wherein an operating temperature ($T_B$) of the respective semiconductor switch is measured and compared to a temperature threshold value ($T_{thresh}$), wherein a load current ($I_c$) switched by means of the respective semiconductor switch is measured and compared to a current threshold value ($I_{thresh}$), and
(Continued)

wherein the control signal (P') for setting the switch-off speed ($A_{new}$) is generated on the basis of the comparisons.

9 Claims, 3 Drawing Sheets

(51) Int. Cl.
| | |
|---|---|
| *B60L 15/08* | (2006.01) |
| *H03K 17/14* | (2006.01) |
| *H03K 17/16* | (2006.01) |
| *H02M 1/00* | (2006.01) |

(52) U.S. Cl.
CPC ............ *H03K 17/14* (2013.01); *H03K 17/145* (2013.01); *H03K 17/163* (2013.01); *H03K 17/168* (2013.01); *B60L 2210/40* (2013.01); *B60L 2240/525* (2013.01); *B60L 2240/527* (2013.01); *B60L 2240/529* (2013.01); *H02M 2001/0029* (2013.01); *H03K 2217/0036* (2013.01); *Y02T 10/645* (2013.01); *Y02T 10/7241* (2013.01)

(58) Field of Classification Search
CPC ...... H02M 7/53875; H02M 2001/0029; H03K 17/14; H03K 17/145; H03K 17/163; H03K 17/168; H03K 2217/0036; B60L 15/08; B60L 2210/40; B60L 2240/525; B60L 2240/527; B60L 2240/529; Y02T 10/7241; Y02T 10/645
See application file for complete search history.

(56) References Cited

U.S. PATENT DOCUMENTS

| | | | |
|---|---|---|---|
| 2001/0002782 A1 | 6/2001 | Shimane et al. | |
| 2005/0253165 A1 | 11/2005 | Pace et al. | |
| 2012/0039100 A1 | 2/2012 | Hirose | |
| 2014/0001839 A1 | 1/2014 | Kakimoto | |
| 2016/0036430 A1 | 2/2016 | Rannestad | |
| 2016/0226386 A1* | 8/2016 | Fukuta | ................... B60L 11/18 |
| 2017/0021733 A1* | 1/2017 | Kondou | .................. B60L 11/08 |
| 2019/0115772 A1* | 4/2019 | Takeda | .................. H02J 7/0063 |

FOREIGN PATENT DOCUMENTS

| | | |
|---|---|---|
| DE | 10 2014 219 470 A1 | 3/2016 |
| EP | 2256917 A1 | 12/2010 |
| EP | 2733849 A1 | 5/2014 |
| JP | 2010-252451 A | 11/2010 |

OTHER PUBLICATIONS

PCT/ISA/210, 220 & 237, "ISR with Written Opinion of the ISA for International Application No. PCT/EP2017/073102", dated Dec. 18, 2017.

\* cited by examiner

METHOD FOR OPERATING A CURRENT CONVERTER AND CURRENT CONVERTER OPERATING ACCORDING TO SAID METHOD

RELATED APPLICATIONS

The present application is National Phase of International Application No. PCT/EP2017/073102 filed Sep. 14, 2017, and claims priority from German Application No. 10 2016 217 494.0, filed Sep. 14, 2016, the disclosure of which is hereby incorporated by reference herein in its entirety.

BACKGROUND OF THE INVENTION

The invention relates to a method for operating a current converter, in particular an electric machine, with which, for the or for each semiconductor switch of the current converter, a control signal for setting a switch-off speed of the semiconductor switch is generated. The invention also relates to a current converter operating in accordance with this method, and to an electric machine comprising a current converter of this kind.

Motor vehicles driven electrically (by electric motor), for example electric or hybrid vehicles, typically have electric or electromotive machines for driving one or both motor vehicle axles. Electromotive drive machines of this kind generally comprise a controlled synchronous or asynchronous motor as electric motor, which is coupled to an energy store within the vehicle (high-voltage battery) in order to be supplied with electrical energy.

The electric motor of the electric machine usually comprises a rotor mounted rotatably relative to a stator, which rotor is driven by means of a magnetic rotary field. In order to generate the rotary field, the coils (phase windings, stator windings) of the stator are acted on by an appropriate three-phase current (alternating voltage) as motor current, which is converted from a direct voltage or a direct current (input current) of the energy store by means of a current converter.

Current converters of this kind on the one hand are suitable and designed for converting, as inverters, the input current of the energy store into the motor current in normal operation of the machine. On the other hand, the current converters are generally suitable and designed for converting, as rectifiers, a generated motor current of the electric motor into a direct current (regenerative current) for feeding into the energy store in generative or recuperative operation.

For this purpose, the current converter has a bridge circuit (intermediate circuit, commutation circuit) coupled to an intermediate circuit capacitor. The bridge circuit comprises a number of bridge modules (half-bridges, power module, commutation cell) corresponding to the (motor) phases, said bridge modules comprising semiconductor switches which are connected between an outward line and a return line of the current converter.

In order to control the semiconductor switches of the bridge modules, driver circuits are generally provided, which generate pulse width modulated control signals (PWM signals) depending on signals of a controller (motor control unit). The control signals are guided to a control connection of the semiconductor switching question, which is thus switched in a clocked manner between a conductive (connected) state and a non-conductive (disconnected, blocking) state. In operation the semiconductor switches, embodied for example as IGBTs (insulated gate bipolar transistors), are switched in a clocked manner via their respective gate connections to the control signals, whereby the collector or load current to be switched is consequently converted into the three-phase current for the drive of the rotor.

The electrical power loss of a current converter of this kind is determined substantially by conduction and switching losses if the bridge modules or semiconductor switches thereof. Here, the (gate) control method characterised by the control signals has a significant influence on the magnitude of the power losses that occur—and therefore on the efficiency—of the current converter. The semiconductor switches generally have a comparatively slow switch-off speed, which signifies a long (switch-off) duration of a switch-off process from the conductive state into the non-conductive state. In operation, this results in an undesirably high proportion of electrical losses during the switch(over) processes of the semiconductor switches.

in a switch-off process of this kind the collector or load current to be switched, which flows through the semiconductor switch in the conductive state, is reduced until it is switched off in essence. The switch-off speed is defined here substantially by the gradient of the resultant current flank of the load current, by which the duration of the switch-off processes determined. This switch-off speed can be set or controlled by open-loop and/or closed-loop control by means of the control signal for (gate) control of the semiconductor switches.

Document DE 10 2014 219 470 A1 discloses a method for the temperature-dependent selection of switch-off speeds for switch-off processes in semiconductor switches. There, the semiconductor switches are arranged in a DC intermediate circuit of a converter. In operation a direct voltage of the DC intermediate circuit is measured and compared to a reference direct voltage. On the other hand, a temperature, in particular a barrier layer temperature, of the semiconductor switches is measured and compared to a reference temperature. A switch-off speed for the semiconductor switches is set on the basis of the comparisons. Quicker switch-off speeds of the semiconductor switches should thus be made possible for specific working or operating points of the converter.

The object of the invention is to describe a particularly suitable method for operating a current converter. A further object of the invention is to describe a current converter operating by a method of this kind, and an electric machine comprising a current converter of this kind.

SUMMARY OF THE INVENTION

The object is achieved in accordance with the invention in respect of the method by the features of the first aspect, and in respect of the current converter by the features of second aspect, and in respect of the electric machine by the features of the third aspect. Advantageous embodiments and developments are the subject of the dependent claims.

The method according to the invention is suitable and designed for operating a current converter. The current converter is an particular part of an electric machine and is connected as such, for example as an inverter, between a direct current source and an electric motor. The current converter here comprises at least one semiconductor switch, which expediently is coupled to an intermediate circuit of the machine. In order to control the semiconductor switch, a control signal for setting a switch-off speed is generated and is guided to a control connection (control input) of the semiconductor switch.

In operation of the current converter the operating parameters are monitored continuously. Here, on the one hand the electric intermediate circuit voltage of the intermediate circuit is measured and compared to a voltage threshold value. On the other hand, the operating temperature of the respective semiconductor switch is measured and compared to a temperature threshold value. Furthermore, the load current switched by means of the respective semiconductor switch is measured and compared to a current threshold value.

In accordance with the method the control signal is generated here in order to set the switch-off speed on the basis of the three comparisons. This means that in addition to the intermediate circuit voltage-dependent and temperature-dependent setting of the switch-off speed, the load current to be switched is additionally taken into consideration. In other words, additionally to the intermediate circuit voltage and the operating temperature, the load currently applied is taken into consideration in the setting of the switch-off speed.

The working range of the current converter is divided by the threshold values into different operating points and/or operating ranges, which for example each have an associated switch-off speed. The respective threshold values of the operating parameters are expediently greater than the minimum admissible operating parameter values and smaller than the maximum permissible operating parameter values. A particularly flexible adaptation to different operating situations of the current converter is thus possible, whereby the efficiency of the current converter is advantageously increased. In particular, it is for example thus possible at a given switch-off speed to utilise the specified maximum voltage in the event that the operating point is changed.

The semiconductor switches are preferably embodied as IGBTs, wherein the measured intermediate circuit voltage is a measure for the collector-emitter voltage applied in operation, and wherein the operating temperature describes in particular the temperature value of a barrier layer temperature of the semiconductor switch.

A particularly simple and easy adaptation to a respective, application-specific main operating range of the current converter or the electric machine equipped there with it is thus possible by means of the method. In particular, the switch-off speed is set not merely on the basis of maximum limits (for example maximum load current and maximum intermediate circuit voltage), but depending on the desired main operating range. This means that the switch-off speed can be set for a specific operating range operating point of the semiconductor switch more finely or with a high resolution, whereby electrical losses during a switch-off process can be reduced in a targeted and application-oriented manner.

In particular in an application in which current converters of similar design are used in different electric machines, for example in different electrically operated motor vehicles, it is ensured by the method that the current converters can be optimally adapted to the respective main operating range, that is to say the operating range of the respective machine occurring most frequently during operation. The main operating range varies for different machines, wherein a particularly high efficiency is always ensured by means of the method. Furthermore, a costly overdimensioning of the semiconductor switches and/or further components of the current converter is advantageously avoidable hereby.

In a suitable development the control signal for setting the switch-off speed on the basis of the comparisons is selected from three stored switch-off speeds. The first switch-off speed here is slower than the second switch-off speed, wherein the second switch-off speed is slower than the third switch-speed.

In other words, a relatively long duration of the switch-off process is brought about by the first switch-off speed, which means a relatively slow switch-off process with a relatively flat current flank gradient of the load current. The second switch-off speed accordingly brings about a relatively quick switch-off process with a steeper current flank gradient, and the third switch-off speed brings about a particularly quick switch-off process with a particularly steep current flank gradient. Three operating ranges of the current converter are thus defined in principle, whereby particularly simple and easy operation with, simultaneously, maximum flexibility is made possible.

In an advantageous embodiment the control signal is set the first switch-off speed if the measured operating temperature is below the temperature threshold value, and/or if the intermediate circuit voltage is above the voltage threshold value. By means of the relatively slow first switch-off speed, a reliable and dependable switch-off process is ensured for the operating points lying in a limit region of the permitted working range of the semiconductor switches.

In a suitable embodiment the control signal is set to the second switch-off speed if the operating temperature is above the temperature threshold value, and if the load current is above the current threshold value. A relatively quick switch-off speed, with accordingly reduced electrical power loss, is thus realised over a relatively broad voltage range.

In a preferred embodiment the control signal is set to the third switch-off speed the operating temperature is above the temperature threshold value and if the load current is below the current threshold value. Effective and efficient operation of the current converter is thus ensured.

An additional or further aspect of the method according to the invention provides that the current threshold value is set depending on the intermediate circuit voltage. Particularly effective and efficient operation of the current converter is thus ensured. In particular, the course of the current threshold value is adapted here to the desired main operating range, such that the main operating range is preferably located substantially completely in the operating range operating with the third switch-off speed.

The current converter according to the invention is in particular part of an electric machine. The current converter comprises a bridge circuit coupled to the intermediate circuit. The bridge circuit has a number of semiconductor switches controlled by means of driver circuits, wherein the driver circuits are guided in respect of signal exchange to a controller (control unit). Here the controller is generally designed—in respect of programming and/or circuitry—to carry out the above-described method. The controller is thus designed specifically to measure and/or to monitor the (current) values of the intermediate circuit voltage and the operating temperature and the load current during operation of the current converter. The controller is also designed to compare the measured values to the respective, stored threshold values and to adjust the driver circuits for generation of the control signal on the basis of the comparison.

In a preferred embodiment the controller is formed at least in essence by a microcontroller having a processor and a data memory, in which the functionality for carrying out the method according to the invention is implemented from a programming viewpoint in the form of an operating software (firmware), such that the method—optionally in interaction with a (vehicle) user—is carried out automatically with execution of the operating software in the microcontroller.

The controller within the scope of the invention, however, may also be formed alternatively by a non-programmable electronic component, for example in ASIC (application-specific integrated circuit), in which the functionality for carrying out the method according to the invention is implemented using circuitry measures.

The current converter operated by means of the method thus always has the most optimal switch-off speed possible of the semiconductor switches in accordance with the respective operating point.

In an advantageous development the driver circuits have a number of electrical series resistors (switch-off resistor) corresponding to the number of settable switch-off speeds. The switch-off speed of the semiconductor switches that is optimal in respect of losses thus can be selected in a simple manner by means of a voltage-, temperature- and load-dependent switchover between the different series resistors. The (gate) series resistors have suitably different (ohmic) resistance values, such that the amplitude of the control signal is varied in the event of a switchover. As a result of the altered amplitude, the semiconductor switch is consequently switched off with an altered switch-off speed.

In an expedient embodiment the series resistors of the driver circuits are connected parallel to one another. The controller here controls a respective control circuit of the driver circuits in order to switch over between or switch on the series resistors. The optimal gate series resistor is thus always set depending on the respective operating point. Thus, a hardware-based generation of the various switch-off speeds is provided.

In an alternative embodiment it is also conceivable for example in order to set the switch-off speed if the control signal is set by means of an active clamping or by means of a current control.

In a preferred application the current converter operated in accordance with the method is used in an electric machine, in particular for an electrically operated motor vehicle (electric vehicle, hybrid vehicle). To this end the current converter is connected for example as an inverter between an energy store within the vehicle an electric motor. As a result of the method, effective and reliable operation of the semiconductor switches is ensured, wherein the electric losses in the semiconductor switches are reduced. An electric machine having a particularly high efficiency is thus provided, which enables particularly economical operation of the motor vehicle. This consequently transfers advantageously to the economical requirements in respect of the production of the motor vehicle and to a cost-effective efficient operation of the motor vehicle.

BRIEF DESCRIPTION OF THE DRAWINGS

Exemplary embodiments of the invention will be explained in greater detail hereinafter with reference to a drawing. The drawing shows, in simplified and schematic illustrations.

DETAILED DESCRIPTION OF THE EMBODIMENTS

Parts and variables corresponding to one another are provided with the same reference signs in all figures.

Figure 1:
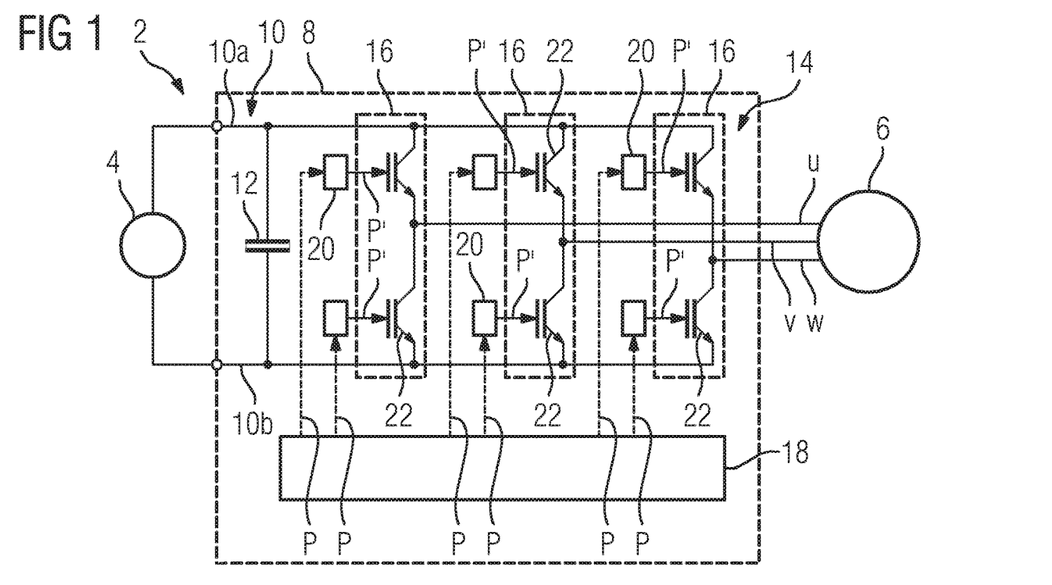
FIG. 1 an electric machine having an energy store and with having electric motor and having a current converter connected therebetween, FIG. 2 a detail of a bridge module of the current converter with a semiconductor switch and a driver circuit coupled thereto, FIG. 3 a diagram of a method for selecting a switch-off speed for a control signal generated by the driver circuit, FIG. 4 a graph of the working range of the current converter with three operating ranges with different switch-off speeds, and FIG. 5 a graph of a working range with three adapted operating ranges for highly effective operation of the current converter.

FIG. 1 shows an electric (drive) machine 2 of an electromotive Lee driven motor vehicle (not shown in greater detail), in particular an electric vehicle or hybrid vehicle. The machine 2 in this exemplary embodiment comprises an electrical energy store 4 within the vehicle in the form of a high-voltage battery and an electric motor 6 driving the motor vehicle axles. The electric motor 6 embodied for example as a synchronous or asynchronous motor is connected here to the energy store 4 by means of a current converter 8 embodied as an inverter.

The current converter 8 comprises a outward line 10a and a return line 10b. The outward line 10a and the return line 10b are part of an intermediate circuit 10, by means of which the current converter 8 is connected to the energy store 4. An intermediate circuit capacitor 12 and a bridge circuit 14 having three bridge modules (half-bridges, commutation cells) 16, is connected between the lines 10a and 10b.

In operation an input current of the energy store 4 fed to the current converter 8 is converted by the bridge circuit 14 into a three-phase motor voltage or a having the phases three-phase current u, v, w. The phases u, v, w—also referred to hereinafter comprehensively as motor current—are guided for operation of the electric motor 6 to corresponding phase or winding ends of a stator (not shown in greater detail).

in order to convert the input current provided from the high-voltage direct voltage of the energy store 4 into the motor current, the bridge modules 16 are controlled by open-loop and/or closed-loop control by means of a controller 18 connected to a motor control unit. For this purpose the controller 18 sends a PWM signal P (pulse width modulated) to one of six driver circuits 20. Each bridge module 16 here comprises two semiconductor switches 22 embodied as IGBTs (insulated gate bipolar transistors, the respective control connection of which (gate connection) is guided to the output of the corresponding associated driver circuit 20. In a possible alternative embodiment the driver circuits 20 are for example part of the respective bridge module 16. In FIG. 1 the semiconductor switches 22 and driver circuits 20 are provided with reference signs merely by way of example.

Figure 2:
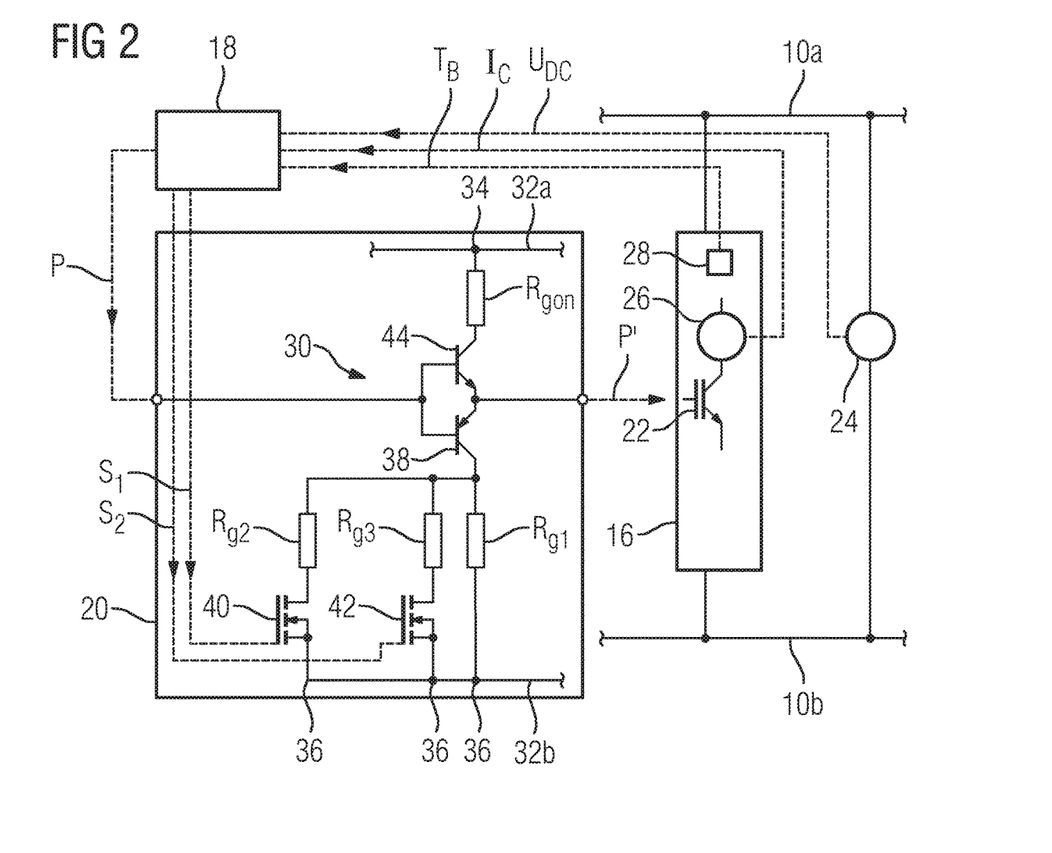

The driver circuit 20 of a semiconductor switch 22 will be explained in greater detail hereinafter with reference to FIG. 2. FIG. 2 shows merely a semiconductor switch 22 of the bridge module 16 by way of example. The shown driver circuit 22 is suitable and designed for switching off the semiconductor switch 22 (meaning switching over from a conductive state to a blocking state) with three different switch-off speeds $A_1$, $A_2$, $A_3$.

As shown in FIG. 2 a voltmeter 24 for measuring the direct voltage or intermediate circuit voltage $U_{dc}$ applied between the lines 10a and 10b is arranged between the positive (direct voltage) potential of the outward line 10a and the negative (direct voltage) potential of the return line 10b. The bridge module 16 here comprises a temperature meter 26 for detecting an operating temperature $T_B$, in particular a barrier layer temperature, of the semiconductor 22. The bridge module 16 also comprises an ammeter 28, by means of which a collector or load current $I_c$ to be switched by the semiconductor switch 22 is measured.

The measured measurement signals of the voltmeter 24 and of the temperature meter 26 and of the ammeter 28 are guided in respect of signal exchange to an input side of the controller 18. The controller 18 is connected on the output side in respect of signal exchange to the driver circuit 20. In operation the controller 18 sends a first switch signal $S_1$ and a second switch signal $S_2$ and the clocked PWM signal P to the driver circuit 20 depending on the received signals. The driver circuit 20 generates a control signal P', in particular for switching off the semiconductor switch 22 depending on the incoming signals.

The driver circuit 20 comprises a control circuit 30. The control circuit 30 is connected to a positive path 32a and a negative path 32b of a direct voltage circuit (not shown in greater detail). The direct voltage circuit is galvanically separated from the intermediate circuit 10 and acts as a voltage supply for the driver circuit 20. For this purpose the control circuit 20 is connected by means of a first connection 34 to the positive path 32a and by means of three second connections 36 to the negative path 32b.

The control circuit 30 comprises three series resistors (gate switch-off series resistors) $R_{g1}$, $R_{g2}$, and $R_{g3}$ connected parallel to one another, which on the one hand are guided to one of the connections 36 each and on the other hand jointly to a semiconductor switch (gate switch-off semiconductor) 38. The series resistor $R_{g2}$ is guided to the associated connection 36 by means of a semiconductor switch 40 controlled by the switch signal $S_1$. The series resistor $R_{g3}$ here is guided to the associated connection 36 by means of a semiconductor switch 42 controlled by the switch signal $S_2$.

The semiconductor switch 38 is controllable by means of the clocked PWM signal P and is guided to the control connection of the semiconductor switch 22. The control of the semiconductor switch 38 is used here in particular to switch off the semiconductor switch 22 with a switch-off speed $A_1$, $A_2$, $A_3$.

The connection 34 is guided to an input connection of a semiconductor switch (gate switch-on semiconductor) 44 by means of a series resistor (gate switch-on series resistor) $R_{gon}$. A switch-on speed during a switch-on process of the semiconductor switch 22, meaning the switchover from a blocking state into a conductive state, can be predefined by the series resistor $R_{gon}$.

As can be seen clearly by way of comparison from FIG. 2, the semiconductor switch 38 controllable by the clocked PWM signal P for the switch-off processes of the semiconductor switch 22 is designed as a pnp transistor. Accordingly, the semiconductor switch 44 controllable by means of the clocked PWM signal P for the switch-on processes of the semiconductor switch 22 is embodied as a npn transistor. It is thus ensured electrically that either merely the semiconductor switch 38 is connected through for the switch-off process or merely the semiconductor switch 44 is connected through for the switch-on process of the semiconductor switch 22, depending on the state (switch state) of the PWM signal P.

In order to generate a control signal P' for switching off the semiconductor switch 22 with the first, relatively slow switch-off speed $A_1$, the semiconductor switches 40 and 42 are switched to be blocking by means of the switch signals $S_1$ and $S_2$. The semiconductor switch 38 is thus guided merely to the negative path 32b by means of the series resistor $R_{g1}$.

In order to switch off the semiconductor switch 22 by the control signal P' with the second, relatively quick switch-off speed $A_2$, the semiconductor switch 40 is switched to be conductive by the switch signal $S_1$, and the semiconductor switch 42 is switched to be blocking by means of the switch signal $S_2$. The series resistors $R_{g1}$ and $R_{g2}$ thus act as a common parallel resistor for the semiconductor switches 38.

In order to generate a control signal P' with the third, relatively very quick switch-off speed $A_3$, the semiconductor switch 40 is switched to be blocking by the switch signal $S_1$, and the semiconductor switch 42 is switched to be conducted by means of the switch signal $S_2$. The series resistors $R_{g1}$ and $R_{g3}$ thus act as a common parallel resistor for the semiconductor switches 38.

The control signal P' thus has substantially the same clock ratio (duty cycle) of the incoming PWM signal P, but differs in respect of the (voltage) amplitude thereof. The series resistors $R_{g1}$, $R_{g2}$ and $R_{g3}$ are preferably dimensioned here in such a way that three different switch-off speeds $A_1$, $A_2$ and $A_3$ can be set for the control signal P' by the switching of the semiconductor switches 40 and 42. In particular, the series resistors $R_{g1}$, $R_{g2}$ and $R_{g3}$ are dimensioned here in such a way that the first switch-off speed $A_1$ is slower than the second switch-off speed $A_2$, and the second switch-off speed $A_2$ is slower than the third switch-off speed $A_3$.

The switch signals $S_1$ and $S_2$ are generated by the controller 18 on the basis of threshold value comparisons of the measured values of the intermediate circuit voltage $U_{dc}$ and the operating temperature $T_B$ and the load current $I_c$ with correspondingly stored threshold values.

Figure 3:
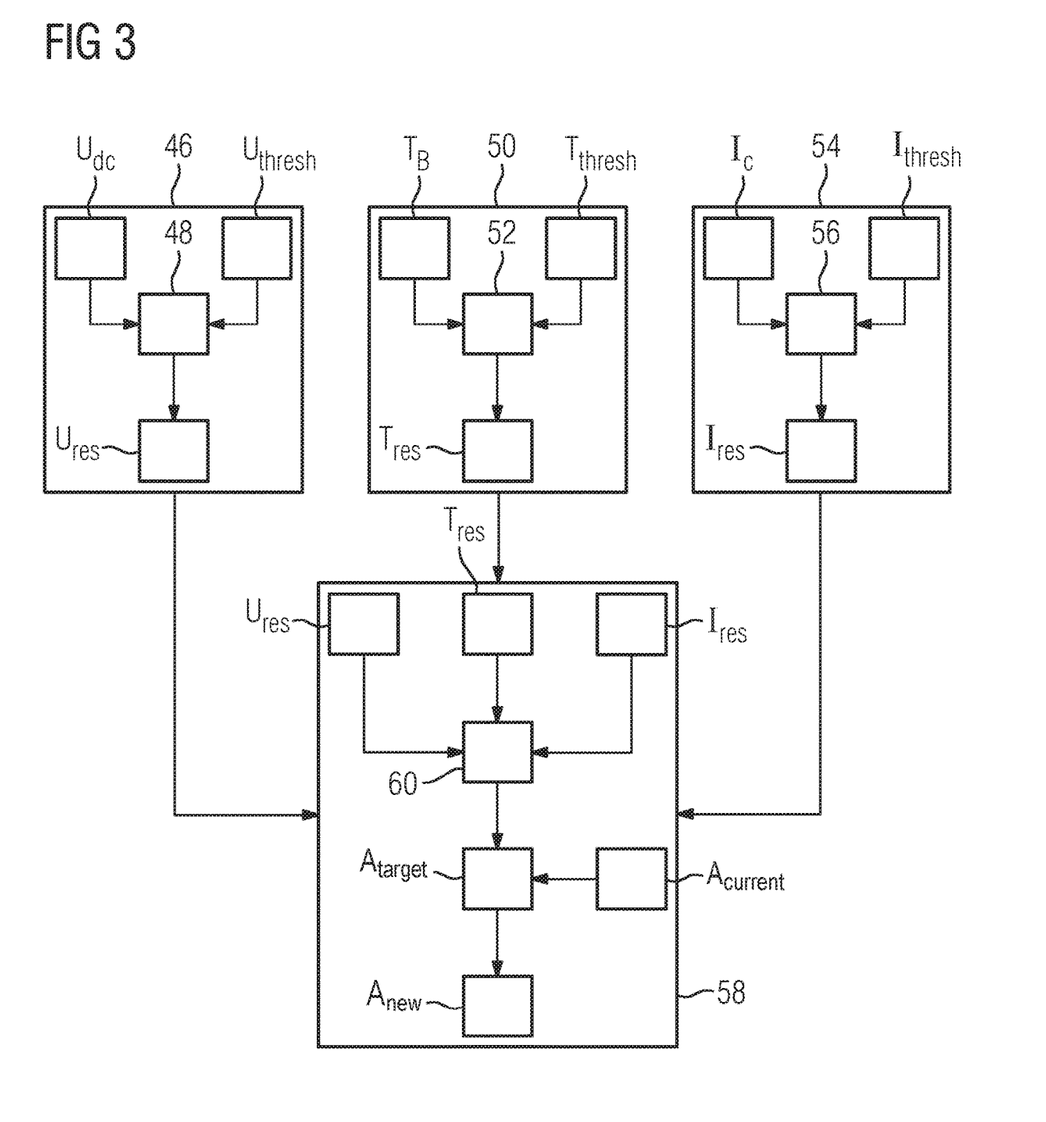

An exemplary embodiment of a method implemented in the controller 18 for selecting and setting a switch-off speed $A_{new}$—and thus generating the switch signals $S_1$ and $S_2$—will be explained hereinafter with reference to the schematic diagram of FIG. 3.

In a first method step 46 the measured value of the intermediate circuit voltage $U_{dc}$ is compared in a threshold value comparison 48 to a stored voltage threshold value $U_{thresh}$. The threshold value comparison 48 provides a voltage result $U_{res}$ on the basis of the comparison.

In a second method step 50 the detected operating temperature $T_B$ is compared in a threshold value comparison 52 to a stored temperature threshold value $T_{thresh}$. The threshold value comparison 52 provides a temperature result $T_{res}$ on the basis of the comparison.

In a third method step 54 a threshold value comparison 56 is performed accordingly between the measured load current $I_c$ and a stored current threshold value $U_{thresh}$. The threshold value comparison 56 generates a current result $I_{res}$ on the basis of the comparison.

The comparison results $U_{res}$, $T_{res}$, $I_{res}$ are then used in a method step 58 for setting the switch-off speed $A_{new}$. To this end the comparison results $U_{res}$, $T_{res}$, $I_{res}$ are combined with one another in a step 60. The combination of the comparison results $U_{res}$, $T_{res}$, $I_{res}$ in step 60 corresponds substantially to the determining of an actual current operating point of the current converter 8. The working range of the current converter 8 is expediently divided into different operating ranges (FIG. 4, FIG. 5), wherein each operating range is assigned a particular switch-off speed $A_1$, $A_2$, $A_3$. The operating ranges are stored in the controller 18 as combination results of the comparison results $U_{res}$, $T_{res}$, $I_{res}$. In other words it is possible to assign the specific current operating point to 1 of these operating ranges—and thus to a target switch-off speed $A_{target}$.

The target switch-off speed $A_{target}$ is compared to an actual current switch-off speed $A_{current}$, wherein, in the event of a deviation of the target switch-off speed $A_{target}$ from the current switch-off speed $A_{current}$, the switch-off speed $A_{new}$ is set to the value of the target switch-off speed $A_{target}$. To this end the controller 18 for example monitors the current and target switch states of the switch signals $S_1$ and $S_2$.

In order to implement a setting to the new switch-off speed $A_{new}$, the controller 18 controls the switch signals $S_1$ and $S_2$ by way of open-loop and/or closed-loop control. For example, if the current converter 8 is operated with the first switch-off speed $A_1$ and determines that the newly measured operating point lies in an operating range with the switch-off speed $A_2$, the semiconductor switch 40 is switched by the switch signal $S_1$ from blocking to conductive, and the semiconductor switch 42 is furthermore switched to be blocking by means of the switch signal $S_2$. A control signal P' is thus consequently generated, by means of which the semiconductor switch 22 is switched off with the switch-off speed $A_2$.

Figure 4:
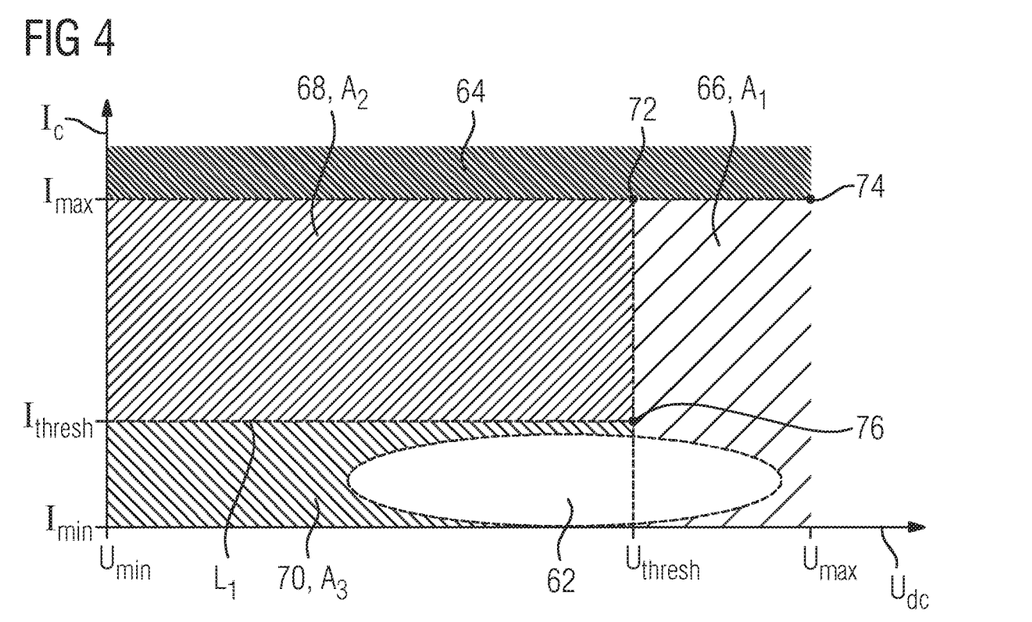
Figure 5:
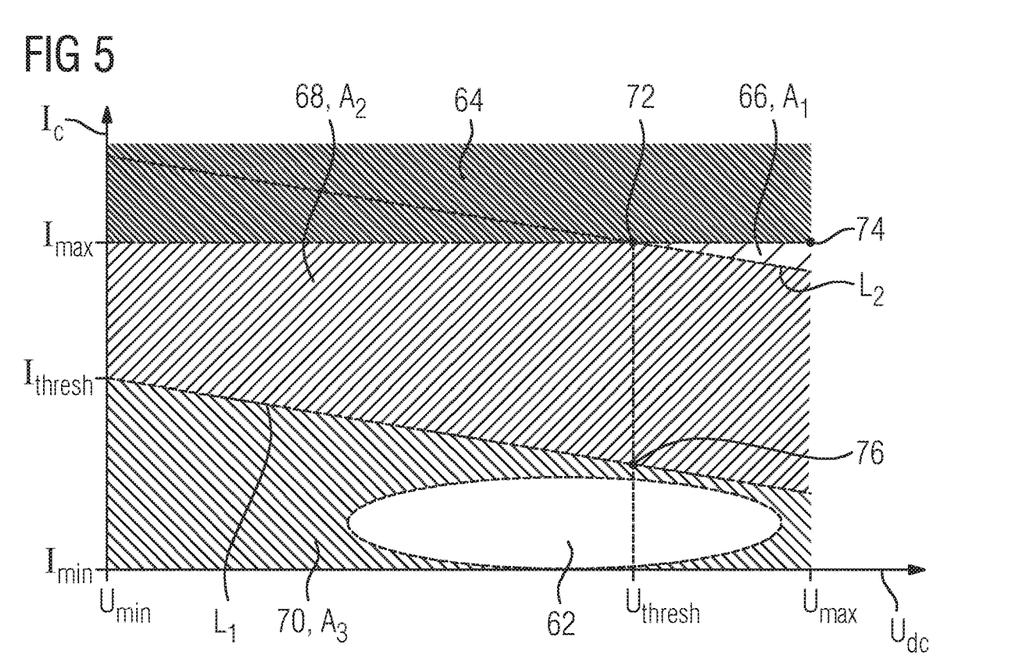

Each of FIGS. 4 and 5 show a working range of the current converter 8 by way of example. Here, the working range covers substantially all operating points of the current converter 8 that are relevant in operation. The shown working range here comprises a main operating range 62 (shown by way of example) of the electric machine 2 and a range 64 in which fault-free operation of the current converter 8 is not possible.

The abscissa axis (x-axis) is in this case a voltage access for the intermediate circuit voltage $U_{dc}$ applied in the intermediate circuit 10. The permissible intermediate circuit voltage $U_{dc}$ is limited here to a voltage range between a minimum voltage $U_{min}$ and a maximum voltage $U_{max}$. The load current $I_c$ is plotted along the ordinate axis (y-axis) and is limited during operation to a current range between a minimum current $I_{min}$ and a maximum current $I_{max}$. The range 64 extends above the maximum current $I_{max}$. An operating point of the current converter 8 is characterised here by a voltage-current value pair ($U_{dc}$, $I_c$).

In operation of the current converter 8 the detected intermedia circuit voltage $U_{dc}$ is compared to the voltage threshold value $U_{thresh}$, and the operating voltage $T_B$ is compared to the temperature threshold value $T_{thresh}$, and the load current $I_c$ is compared to the current threshold value $I_{thresh}$. The voltage threshold value $U_{thresh}$ and the current threshold value $I_{thresh}$ are plotted in FIGS. 4 and 5 as dashed lines in the shown working range.

In FIG. 4 the shown working range is divided by the voltage threshold value $U_{thresh}$ and the current threshold value $I_{thresh}$ substantially into three operating states 66, 68 and 70, which are each associated with a switch-off speed $A_1$, $A_2$ and $A_3$ respectively. In other words, during operation, control signals P' with the associated switch-off speed $A_1$, $A_2$, $A_3$ are generated for all operating points of a particular operating range 66, 68, 70. The current threshold value $I_{thresh}$ is voltage-independent in this exemplary embodiment, which means that the current threshold value $I_{thresh}$ always has substantially the same value for different intermediate circuit voltages $U_{dc}$.

For the operating points of the operating range 66, the control signal P' is set to the first switch-off speed $A_1$. The operating range 66 extends substantially over the entire current range between the minimum current $I_{min}$ and the maximum current $I_{max}$.

The operating range 66 is defined here between a minimum temperature and the temperature threshold value $T_{thresh}$, or between the voltage threshold value $U_{thresh}$ and the maximum voltage $U_{max}$. In other words a control signal P' with the first switch-off speed $A_1$ is generated if it is determined in the step 60 at the temperature result $T_{res}$ of an operating temperature $T_B$ is below the temperature threshold value $T_{thresh}$ or that the voltage result $U_{res}$ corresponds to an intermediate circuit voltage $U_{dc}$ above (or equal to) the voltage threshold value $U_{thresh}$.

The operating range 66 has two (corner) operating points 72 and 74, for which the load current $I_c$ is equal to the maximum current $I_{max}$. In the operating 72 the intermediate circuit voltage $U_{dc}$ is equal to the voltage threshold value $U_{thresh}$ and the operating temperature or barrier layer temperature $T_B$ is equal to the temperature threshold value $T_{thresh}$. In the operating point 74 of the operating range 66 opposite the operating point 72, intermediate circuit voltage $U_{dc}$ is equal to the maximum voltage $U_{max}$, and the operating temperature or barrier layer temperature $T_B$ is equal to the minimum temperature.

For an operating point 76 in which the intermediate circuit voltage $U_{dc}$ is equal to the voltage threshold value $U_{thresh}$ and the load current $I_c$ is equal to the current threshold value $I_{thresh}$, the operating temperature $T_B$ is equal to the temperature threshold value $T_{thresh}$. In this exemplary embodiment a range limit or characteristic curve $L_1$ extends from the minimum voltage $U_{min}$ and the current threshold value $I_{thresh}$ to the operating point 76. The characteristic curve $L_1$ here separates the operating range 70 from the operating range 68.

For an operating point of the operating range 68, a control signal P' having the second switch-off speed $A_2$ is generated. The operating range 68 is defined in the step 60 by a combination of the temperature result $T_{res}$ and the current result $I_{res}$, in which on the one hand the operating temperature $I_B$ is above the temperature threshold value $T_{thresh}$, and on the other hand the load current $I_c$ is above the current threshold value $I_{thresh}$, and furthermore the intermediate circuit voltage $U_{dc}$ is below the voltage threshold value $U_{thresh}$.

The operating range 70 for which the control signal P' is set to the third switch-off speed $A_3$ is likewise stored in the step 60 as a combination of the temperature result $T_{res}$ and the current result $I_{res}$. For the operating range 70, the operating temperature $T_B$ is above the temperature threshold value $T_{thresh}$, and the load current $I_c$ is below the current threshold value $I_{thresh}$, and the intermediate circuit voltage $U_{dc}$ is below the voltage threshold value $U_{thresh}$.

In the exemplary embodiment of FIG. 4 the main operating range 62 extends over the operating ranges 66 and 70, which means that in the main operating range 62 there is a switchover from the first switch-off speed $A_1$ to the third switch-off speed $A_3$. The efficiency and efficacy in the main operating range 62 are thus significantly improved, since (at least in some regions) an increase of the switch(-off) speed is thus possible.

The exemplary embodiment of FIG. 5 shows a working range in which the range limits of the operating ranges 66, 68, 70 are set for the purpose of a particularly high efficiency of the current converter 8. In this exemplary embodiment the characteristic curve $L_1$ defined by the current threshold value $I_{thresh}$ extends between the operating ranges 68 and 70 substantially over the complete voltage range between the minimum voltage $U_{min}$ and the maximum voltage $U_{max}$. The operating ranges 68 and 70 are used merely for operating temperatures $T_B$ greater than or equal to the temperature threshold value $I_{thresh}$. The value of the current threshold value $I_{thresh}$ is dependent here on the particular value of the intermediate circuit voltage $U_{dc}$. The profile of the characteristic curve $L_1$ is determined here on the one hand by the operating point 76 and on the other hand by the used semiconductor switch 22. In the exemplary embodiment the current threshold value $I_{thresh}$ has (monotonically) decreasing profile, which means that the current threshold value $I_{thresh}$ for the minimum voltage $U_{min}$ has a higher current value of the load current $I_c$ than for the maximum voltage $U_{max}$.

In the exemplary embodiment of FIG. 5 the main operating range 62 is thus embedded completely within the operating range 70. In other words control signals P' having the third switch-off speed $A_3$ are generated for all operating points of the main operating range 62. Particularly effective operation of the current converter 8 is thus ensured.

The operating range 66' is stored here in the step 60 by a combination in which the temperature result $T_{res}$ corresponds to an operating temperature $T_B$ below the temperature threshold value $T_{thresh}$ and in which the voltage result $U_{res}$ corresponds to an intermediate circuit voltage $U_{dc}$ above the voltage threshold value $U_{thresh}$. Here, an additional range limit or characteristic curve $L_2$ is provided, which runs substantially parallel to the current threshold value $I_{thresh}$ and thus separates the operating ranges 68 and 66' from one another.

The operating range 66' in this exemplary embodiment comprises relatively few operating points, which occur merely in a few operating situations. The operating ranges 68 and 70—in comparison to the above-described exemplary embodiment—each comprise a greater number of operating points, and therefore the semiconductor switches 22 are switched off over wide sections of the operating range with a quick or very quick switch-off speed $A_2$ or $A_3$ respectively.

In a suitable dimensioning the minimum current $I_{min}$ is for example 0 A (amperes), the current threshold value $I_{thresh}$ is approximately 400 A, and the maximum current $I_{max}$ is approximately 650 A. Suitable voltage values of the intermediate circuit voltage $U_{dc}$ here are for example 250 V for the minimum voltage $U_{min}$, 400 V for the voltage threshold value $U_{thresh}$, and 450 V for the maximum permissible intermediate circuit voltage $U_{max}$. The operating temperature $T_B$ preferably has a minimum temperature $T_{min}$ of approximately −40° C. and a temperature threshold value $T_{thresh}$ of approximately 25° C.

The characteristic curve $L_1$ of the current threshold value $I_{thresh}$ is generated here in that firstly the (switch-off) series resistor $R_{g3}$ of the control circuit 30 is switched on. The operating point 76 is thus defined as starting point. The further points of the characteristic curve $L_1$ are consequently defined by the maximum permissible (collector-emitter) blocking voltage of the semiconductor switches 22, and are determinable by means of the intermediate circuit voltage $U_{dc}$ and the switch-off voltage—caused by the inductance of the intermediate circuit 10—of the semiconductor switches 22.

The characteristic curve $L_2$ is generated in a manner similar to the characteristic curve $L_1$, wherein however the series resistor $R_{g2}$ is connected in the control circuit 30 instead of the series resistor $R_{g3}$. The operating point 72 is thus determined as a starting point of the characteristic curve $L_2$. By means of the characteristic curve $L_2$ the first switch-off speed $A_1$ is set depending on the load current $I_c$ and the intermediate circuit voltage $U_{dc}$ if the operating temperature $T_B$ (for example 60° C.) is above the temperature threshold value $T_{thresh}$ (25° C.). This case applies for example at an operating point ($U_{dc}$=430 V, $I_c$=500 A) at which the load current $I_c$ is above the current threshold value (400 A) and the intermediate circuit voltage is above the voltage threshold value (400 V).

Provided the operating temperature $T_B$ (for example −40° C.) is below the temperature threshold value (25° C.), the current converter 8—independently of the operating point ($U_{dc}$, $I_c$)—is operated with the slow switch-off speed $A_1$. Here, the resistance value of the series resistor $R_{g1}$ is dimensioned suitably for reliable switching at lower operating temperatures $T_B$ of the semiconductor switches 22.

If the operating temperature $T_B$ is greater than the temperature threshold value $T_{thresh}$ and the operating point ($U_{dc}$, $I_c$) of the current converter 8 is between the characteristic curves $L_1$ and $L_2$, the control signal P' having the second switch-off speed $A_2$ is generated.

In other words, in method step 58, the temperature result $T_{res}$ is firstly evaluated. If the temperature result $T_{res}$ corresponds to an operating temperature $T_B$ which is below the temperature threshold value $T_{thresh}$, the control signal P' having the first switch-off speed $A_1$ is generated independently of the voltage result $U_{res}$ and the current result $I_{res}$.

If the temperature result $T_{res}$ corresponds to an operating temperature $T_B$ which is greater than or equal to the temperature threshold value $T_{thresh}$, a suitable switch-off speed is selected depending on the particular operating point. If the operating point defined by the voltage result $U_{res}$ and the current result $I_{res}$ is above the characteristic curve $L_2$, the control signal P' having the first switch-off speed $A_1$ is generated (operating range 66'). If the operating point is located between the two characteristic curves $L_1$ and $L_2$, i.e. in the operating range 68, the second switch-off speed $A_2$ is thus set. Accordingly, the third switch-off speed $A_3$ is set for operating points below the characteristic curve $L_1$ (operating range 70).

The invention is not limited to the above-described exemplary embodiments. Rather, other variants of the invention may also be derived herefrom by a person skilled in the art, without departing from the scope of the invention. In particular, all individual features described in conjunction with the exemplary embodiments also can be combined with one another in other ways, without departing from the scope of the invention.

For example, the number of different switch-off speeds—and therefore series resistors—is arbitrary in essence. It is essential that, in accordance with the method, the most optimal switch-off speed possible is always set in accordance with the particular operating point.

The invention claimed is:

1. A method for operating a current converter of an electric machine, in which, for at least one semiconductor switch of the current converter a control signal (P') for setting a switch-off speed ($A_{new}$) is generated,
   wherein an electric intermediate circuit voltage (Udc) of an intermediate circuit is measured and compared to a voltage threshold value ($U_{thresh}$),
   wherein an operating temperature ($T_B$) of the at least one semiconductor switch is measured and compared to a temperature threshold value ($T_{thresh}$),
   wherein a load current ($I_c$) switched by means of the at least one semiconductor switch is measured and compared to a current threshold value ($I_{thresh}$), and
   wherein the control signal (P') for setting the switch-off speed ($A_{new}$) is generated on a basis of comparisons of the electric intermediate circuit voltage (Udc), the operation temperature ($T_B$) of the at least one semiconductor switch, and the load current ($I_c$), wherein the control signal (P') for setting the switch-off speed ($A_{new}$) is selected on a basis of comparisons from three stored switch-off speeds ($A_1$, $A_2$, $A_3$), wherein a first switch-off speed ($A_1$) is slower than a second switch-off speed ($A_2$), and the second switch-off speed ($A_2$) is slower than third switch-off speed ($A_3$).

2. The method according to claim 1, wherein the control signal (P') is set to the first switch-off speed ($A_1$) if the operating temperature ($T_B$) is below the temperature threshold value ($T_{thresh}$), and/or of the intermediate circuit voltage ($U_{dc}$) is above the voltage threshold value ($U_{thresh}$).

3. The method according to claim 1, wherein the control signal (P') is set to the second switch-off speed ($A_2$) if the operating temperature ($T_B$) is above the temperature threshold value ($T_{thresh}$), and if the load current ($I_c$) is above the current threshold value ($I_{thresh}$).

4. The method according to claim 1, wherein the control signal (P') is set to the third switch-off speed ($A_3$) if the operating temperature ($T_B$) is above the temperature threshold value ($T_{thresh}$), and if the load current ($I_c$) is below the current threshold value ($I_{thresh}$).

5. The method according to claim 1, wherein the current threshold value ($I_{thresh}$) is set depending on the intermediate circuit voltage ($U_{dc}$).

6. A current converter of an electric machine, having a bridge circuit comprising a number of semiconductor switches controlled by means of driver circuits, and having a controller, which is guided in respect of signal exchange to the driver circuits and which is provided and designed to carry out a method according to claim 1.

7. The current converter according to claim 6, wherein the driver circuits have a number of electrical series resistors ($R_{g1}$, $R_{g2}$, $R_{g3}$) corresponding to the number of settable switch-off speeds ($A_1$, $A_2$, $A_3$).

8. The current converter according to claim 7, wherein series resistors ($R_{g1}$, $R_{g2}$, $R_{g3}$) of the driver circuits are connected parallel to one another, and in that the controller controls a respective control circuit of the driver circuits in order to switch over between the series resistors ($R_{g1}$, $R_{g2}$, $R_{g3}$).

9. An electric machine for an electrically operated motor vehicle, having a current converter according to claim 6 connected between an energy store and an electric motor.

* * * * *